United States Patent
Chen et al.

(10) Patent No.: US 7,573,728 B2
(45) Date of Patent: Aug. 11, 2009

(54) FLEXIBLE DUAL-AXIS CIRCUIT BOARD

(75) Inventors: Ching-Shih Chen, Taoyuan (TW); Chin-Chung Shih, Taoyuan (TW); Yun-Long Tun, Taoyuan (TW); Ming-San Huang, Taoyuan (TW); Yi-Shen Wang, Taoyuan (TW); John C. Wang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 118 days.

(21) Appl. No.: 11/555,456

(22) Filed: Nov. 1, 2006

(65) Prior Publication Data

US 2007/0146975 A1    Jun. 28, 2007

(30) Foreign Application Priority Data

Dec. 28, 2005   (TW)   .............................. 94147066 A

(51) Int. Cl.
H04B 1/03 (2006.01)
(52) U.S. Cl. ................... 361/814; 361/683; 361/752
(58) Field of Classification Search ................ 361/814, 361/683, 752
See application file for complete search history.

(56) References Cited

U.S. PATENT DOCUMENTS

| | | | |
|---|---|---|---|
| 6,616,467 B2 * | 9/2003 | Ibaraki et al. ............... 439/165 |
| 6,728,557 B1 * | 4/2004 | Tracy et al. ............... 455/575.3 |
| 6,742,221 B2 * | 6/2004 | Lu et al. ........................ 16/367 |
| 6,845,546 B1 * | 1/2005 | Lu et al. ........................ 16/367 |
| 7,016,183 B2 * | 3/2006 | Takemoto et al. ............ 361/683 |
| 7,158,816 B1 * | 1/2007 | Mizuta et al. ............. 455/575.3 |
| 7,353,049 B2 * | 4/2008 | Mizuta ..................... 455/575.3 |
| 2004/0061999 A1 * | 4/2004 | Takemoto et al. ............ 361/683 |
| 2005/0018409 A1 * | 1/2005 | Hirakata ....................... 361/752 |
| 2006/0048338 A1 * | 3/2006 | Lowry et al. ................... 16/367 |
| 2006/0112519 A1 * | 6/2006 | Harmon et al. ................ 16/367 |
| 2007/0050946 A1 * | 3/2007 | Shih et al. ...................... 16/367 |

FOREIGN PATENT DOCUMENTS

| | | |
|---|---|---|
| CN | 1450689 A | 10/2003 |
| EP | 1339203 A2 | 8/2003 |
| EP | 1507387 A1 | 2/2005 |
| TW | 245853 B | 12/2005 |

* cited by examiner

*Primary Examiner*—Jeremy C Norris
*Assistant Examiner*—Xiaoliang Chen

(57) ABSTRACT

A dual-axis circuit board is disclosed. The circuit board includes at least an upper circuit board, a lower circuit board, and a connecting circuit board. The upper circuit board connects to the circuit in a top cover of the folding electronic apparatus, and the lower circuit board connects to the circuit in the body of the folding electronic apparatus. The angle between the folding directions of the upper and lower circuit board is approximately 90 degrees.

12 Claims, 5 Drawing Sheets

FLEXIBLE DUAL-AXIS CIRCUIT BOARD

RELATED APPLICATIONS

The present application is based on, and claims priority from, Taiwan Application Serial Number 94147066, filed Dec. 28, 2005, the disclosure of which is hereby incorporated by reference herein in its entirety.

BACKGROUND

1. Field of Invention

The present invention relates generally to a dual-axis circuit board, and more particularly to a flexible dual-axis circuit board with multidirectional motility.

2. Description of Related Art

People use numerous kinds of portable electronic devices in their daily lives, such as pagers, cellular phones, personal digital assistants (PDAs), and pocket PCs. People find these devices so convenient that manufacturers make every endeavor to design more user-friendly products in order to meet consumer demand.

One major improvement was the design of a foldable device. This design has two advantages. First, it increases the amount of information that can be displayed at a time because the size of the screen can be increased. Second, the operation interface can contain more functions because the size of the interface can be increased. The device comprises three main parts: an upper cover, a body, and a hinge. In general, this kind of foldable structure can be opened and closed in only one direction, which limits practical use. Furthermore, the screen, in order to match the cover and body, must be shaped like a rectangle and oriented in only one direction, which is not convenient for users to read documents and websites that are oriented otherwise.

The new designs can accommodate different operating modes. The upper cover can open and close along two orthogonal directions selectively, making the screen disposed in either portrait or landscape mode to fit the visual demand. In this kind of foldable device, electronic signal transmission necessitates a dual-axis circuit board. The dual-axis circuit board could be a dual-axis cable, too.

A kind of known flexible circuit board could be assembled with a two-dimensional dual-axis hinge. The flexible circuit board, extended from the upper cover or the body of the foldable device and its end, circles one side of the hinge and then connects with the circuit board in the body or the upper cover of the foldable device.

However the known structure has some disadvantages:

1. This kind of two-dimensional dual-axis hinge must be applied in a foldable device that has a raised base or an indentation. This application degrades the appearance and value of electronic products, making them look cheap, and also affects the convenience of input as it interferes with handling postures.

2. The manner in which the flexible circuit board circles the hinge reduces the durability of the flexible circuit board. After frequent operation, the transmitting components of the flexible circuit board become fragile.

3. This kind of flexible circuit board is an extension of the circuit board of the upper cover or the body. If the flexible circuit board is damaged, the time and material costs of repairing are very high.

SUMMARY

It is therefore an aspect of the present invention to provide a multidirectional and flexible dual-axis circuit board. When it applies to a portable electronic product, the upper cover and the body of the foldable device are foldable in two directions. Furthermore, because the dual-axis circuit board circles the hinge with sufficient length, it can absorb the stress produced by frequent folding and unfolding. The probability of damage or breakage can be lowered significantly, thereby increasing the operating reliability of personal electronic products.

It is another aspect of the present invention to provide a flexible dual-axis circuit board that is assembled into a dual-axis hinge as an independent part. The repair time and material costs of maintenance can thereby be reduced significantly.

It is still another aspect of the present invention to provide a flexible dual-axis circuit board hidden inside the dual-axis hinge to connect with the transmission circuit of the upper cover and the body of the portable electronic product so as to avoid exposing the vulnerable circuit board, thereby reducing malfunction resulting from external forces.

According to the aforementioned aspects of the present invention, a new dual-axis circuit board is provided. In one embodiment of the present invention, the dual-axis circuit board uses a perpendicular connecting section circuit board to connect an upper circuit board and a lower circuit board respectively. When the dual-axis circuit board is assembled into a three-dimensional dual-axis hinge, two ends of the dual-axis circuit board respectively circle around the two hinges of the three-dimensional dual-axis hinge, thus forming two orthogonal circular rings. The ends of two circular loops connect the circuit boards in the upper cover with the body of the foldable device.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
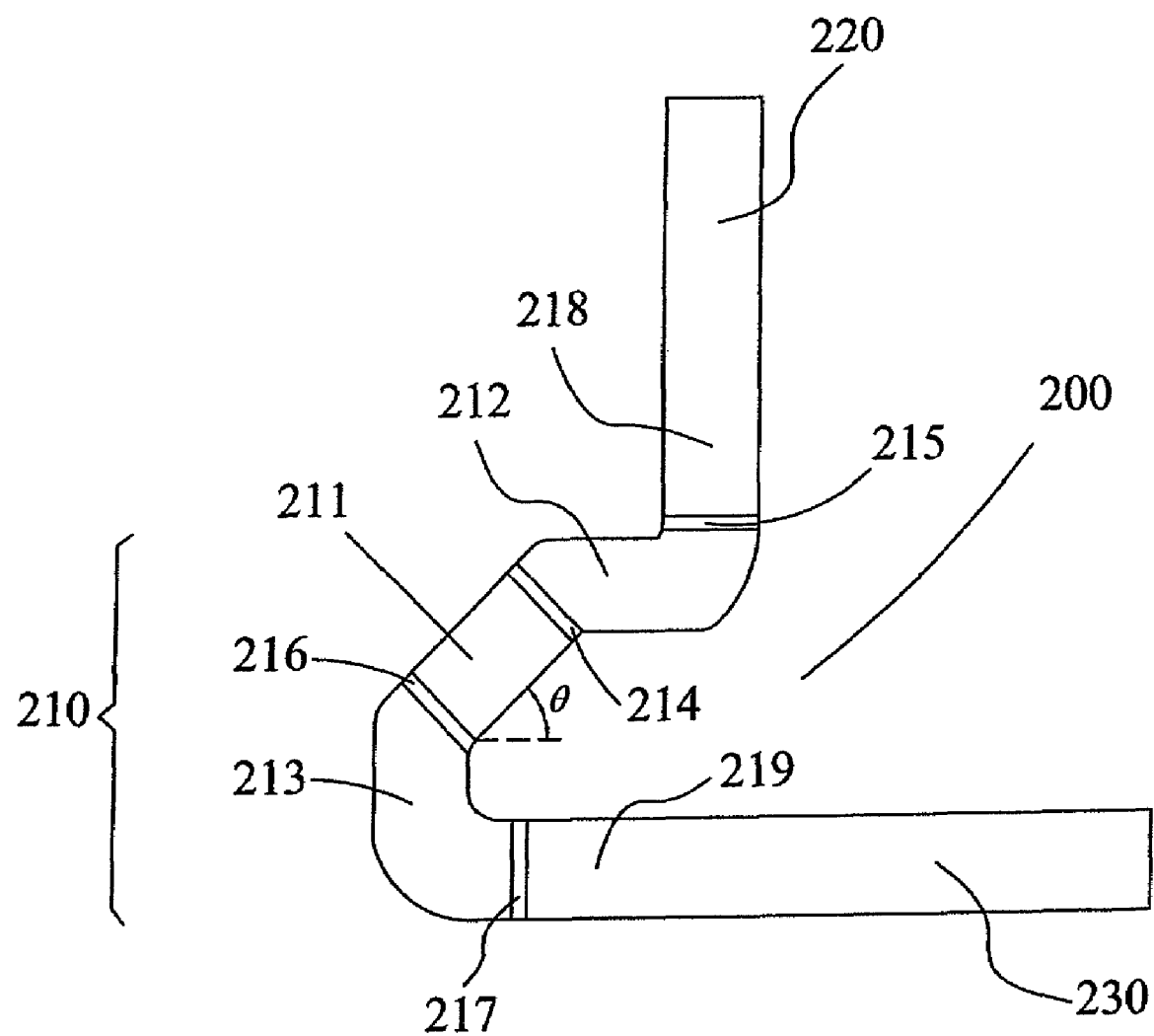
FIG. 1 shows a schematic plan view of a dual-axis circuit board of the preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Reference is made to FIG. 1, which illustrates a flexible dual-axis circuit board of the preferred embodiment of the present invention. A flexible dual-axis circuit board 200 includes a connecting section circuit board 210, an upper circuit board 220, a lower circuit board 230, and the flexible dual-axis circuit board 200.

The connecting section circuit board 210 can be several partitioned sections and is shaped somewhat like the character "C." It includes a raised section 211, an upper transition section 212 and a lower transition section 213 that extends from two ends of the raised section 211. An included angle θ of the raised section 211 is preferably 45 degrees from horizontal. An upper loop 218 is disposed between the upper circuit board 220 and the upper transition section 212; and a lower loop 219 is disposed between the lower circuit board 230 and lower transition section 213. Therefore, the upper circuit board 220 and the lower circuit board 230 are preferably disposed orthogonally.

When the flexible dual-axis circuit board 200 is assembled within the hinge of an electronic device, the board cannot be slanted or slid and cannot interfere with the functions of the flexible dual-axis circuit board 200. Hence, there are four preset folding marks (or dents), such as a linkage of the raised section 211 and the upper transition section 212 as a first upper folding mark 214, a linkage of the upper transition section 212 and the upper loop 218 as a second upper folding mark 215, a linkage of the raised section 211 and the lower transition section 213 as a first lower folding mark 216, and a linkage of the lower transition section 213 and the lower loop 219 as a second lower folding mark 217.

Figure 2:
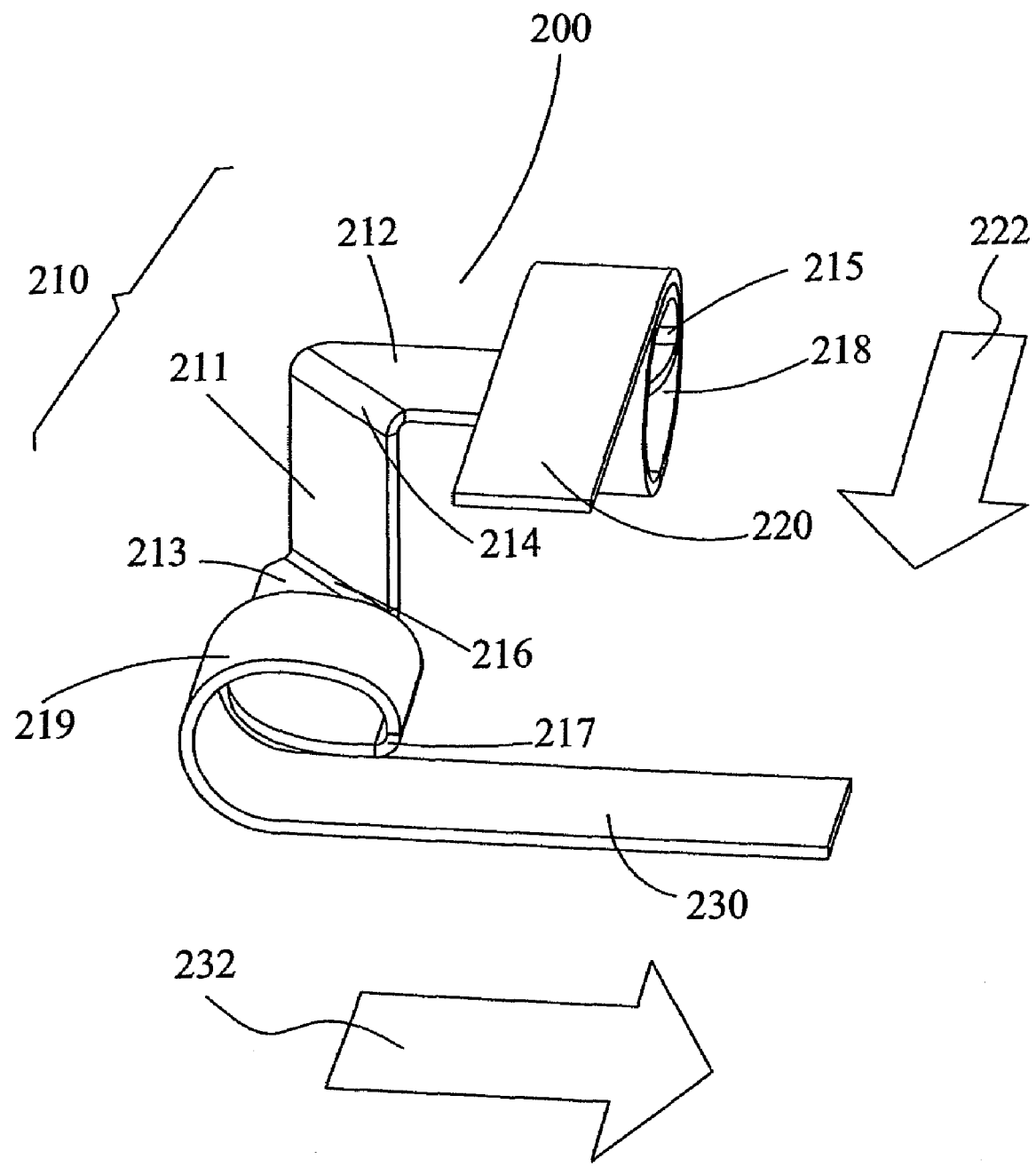
FIG. 2 shows an isometric view of a dual-axis circuit board of the preferred embodiment of the present invention.

FIG. 2 illustrates an isometric view of the wound flexible dual-axis circuit board 200. In a preferred embodiment of the present invention, the flexible dual-axis circuit board 200 comprises at least one connecting section circuit board 210, a first circuit board (like the upper circuit board 220) and a second circuit board (like the lower circuit board 230). The connecting section circuit board 210 comprises the raised section 211, the upper transition section 212 and the lower transition section 213. The included angles between the raised section 211 and the upper transition section 212 and between the raised section 211 and lower transition section 213 are all preferably 90 degrees. Moreover, the connecting section circuit board 210 further includes a first circular loop (like the upper loop 218) and a second circular loop (like the lower loop 219). The first circular loop connects the first circuit board; the second circular loop connects the second circuit board.

The upper circuit board 220 connects behind the upper loop 218 and extends in a first extending direction 222 toward the inside of the flexible dual-axis circuit board 200. The lower circuit board 230 connects behind the lower loop 219 and extends in a second extending direction 232 toward the inside of the flexible dual-axis circuit board 200, too.

The upper circuit board 220 couples with the upper loop 221, and the lower circuit board 230 couples with the lower loop 231, making the upper circuit board 220 and the lower circuit board 230 disposed in two parallel planes; and the upper loop 221 and the lower loop 231 are preset at a certain angle, preferably 90 degrees. The raised section 211, which has a certain length, can make the upper loop 221 and the circular loop 231 form a difference in height.

Figure 3:
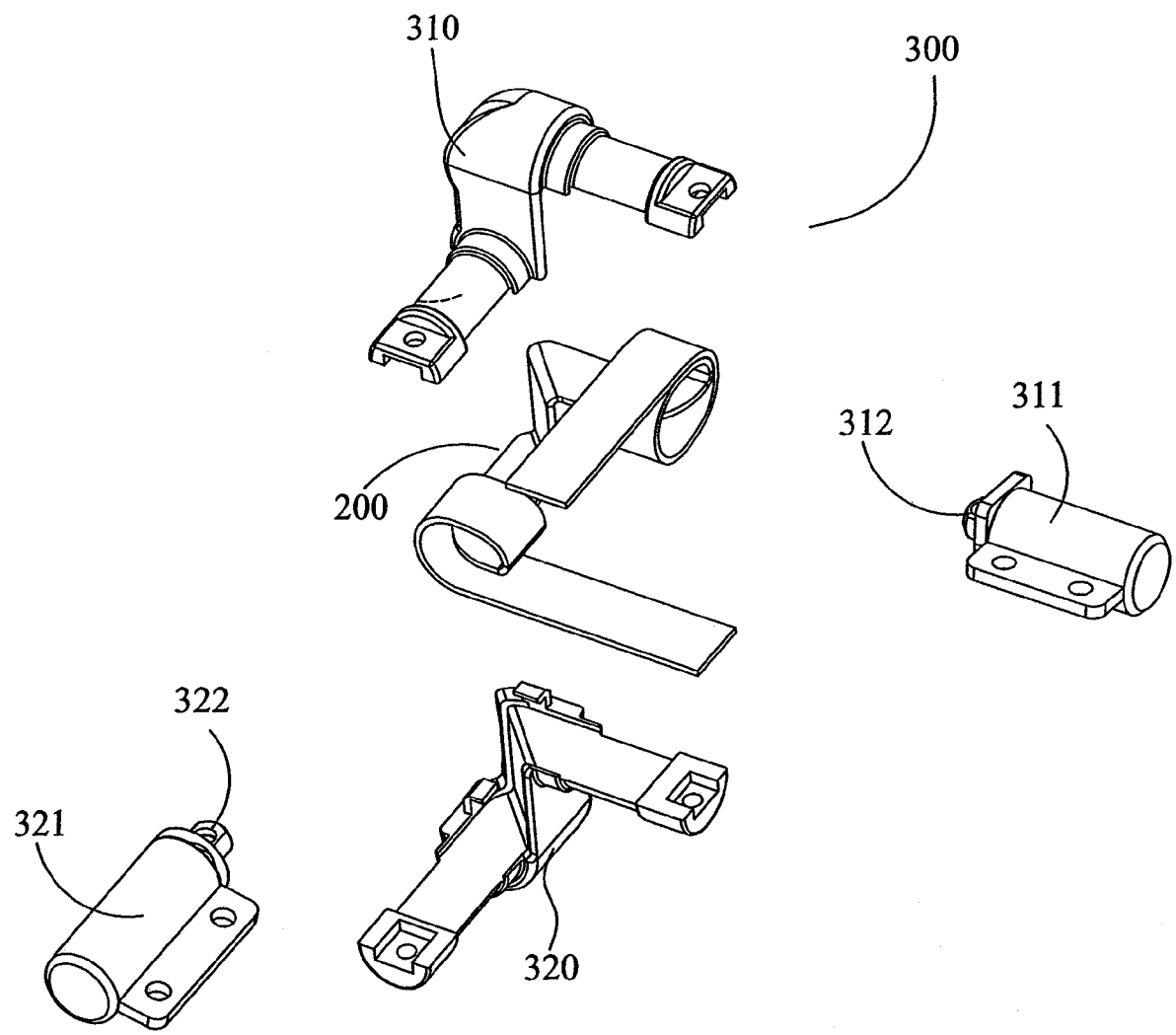
FIG. 3 shows an exploded isometric view of a dual-axis circuit board assembled into a dual-axis hinge of the preferred embodiment of the present invention.

Reference is made to FIG. 3 as well, which illustrates an exploded isometric view of a flexible dual-axis circuit board 200 assembled into a dual-axis hinge 300. The flexible dual-axis circuit board 200 is located between an upper component 310 and a lower component 320. After assembly of the above three components, an upper axis sleeve 311 and lower axis sleeve 321 are connected to two formative hinges by a protrusion 312 and a protrusion 322 respectively.

At the linkage of the upper component 310 and the lower component 320, the upper component 310 and the lower component 320 can be fashioned as concave slots. After the upper component 310 and the lower component 320 are assembled, they can form a circuit cavity and a circuit outlet for passing through the flexible dual-axis circuit board 200.

Figure 4:
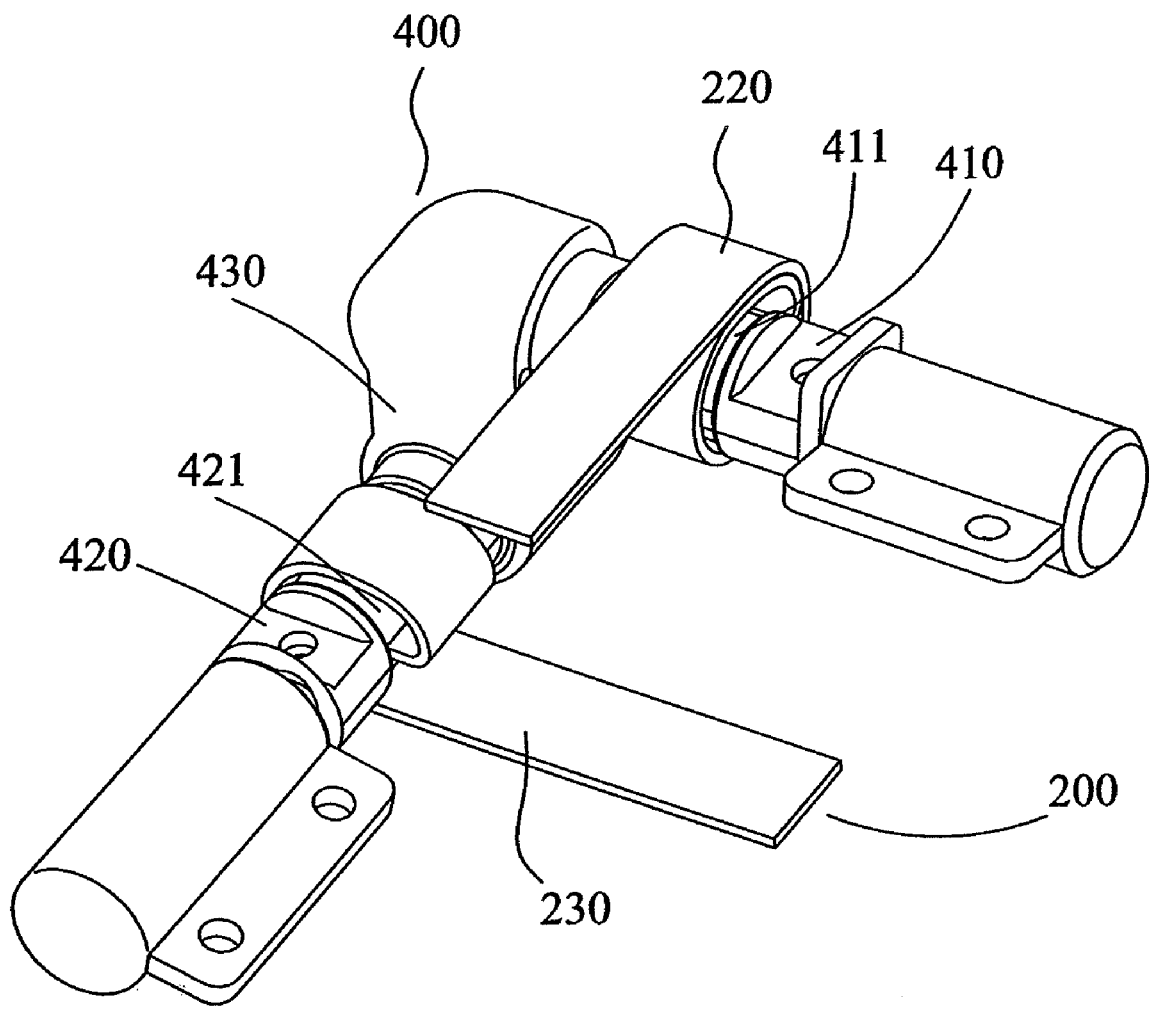
FIG. 4 shows an isometric view of a dual-axis circuit board assembled into a dual-axis hinge of the preferred embodiment of the present invention.

Reference is also made to FIG. 4, illustrating a three-dimensional dual-axis hinge module, which assembles the flexible dual-axis circuit board 200 within a dual-axis hinge 400. The dual-axis hinge 400 comprises an upper hinge 410, a lower hinge 420 and a perpendicular connecting section 430. The perpendicular connecting section 430 can make the upper hinge 410 and the lower hinge 420 disposed in two parallel planes, and these two hinges have a 90-degree included angle. The raised section 211, the upper transition section 212 and the lower transition section 213 all pass through the perpendicular connecting section 430. The upper circuit board 220 circles at least once on an upper concave loop 411 of the upper hinge 410; the lower circuit board 230 also circles at least once on a lower loop 421 of the upper hinge 420.

Figure 5:
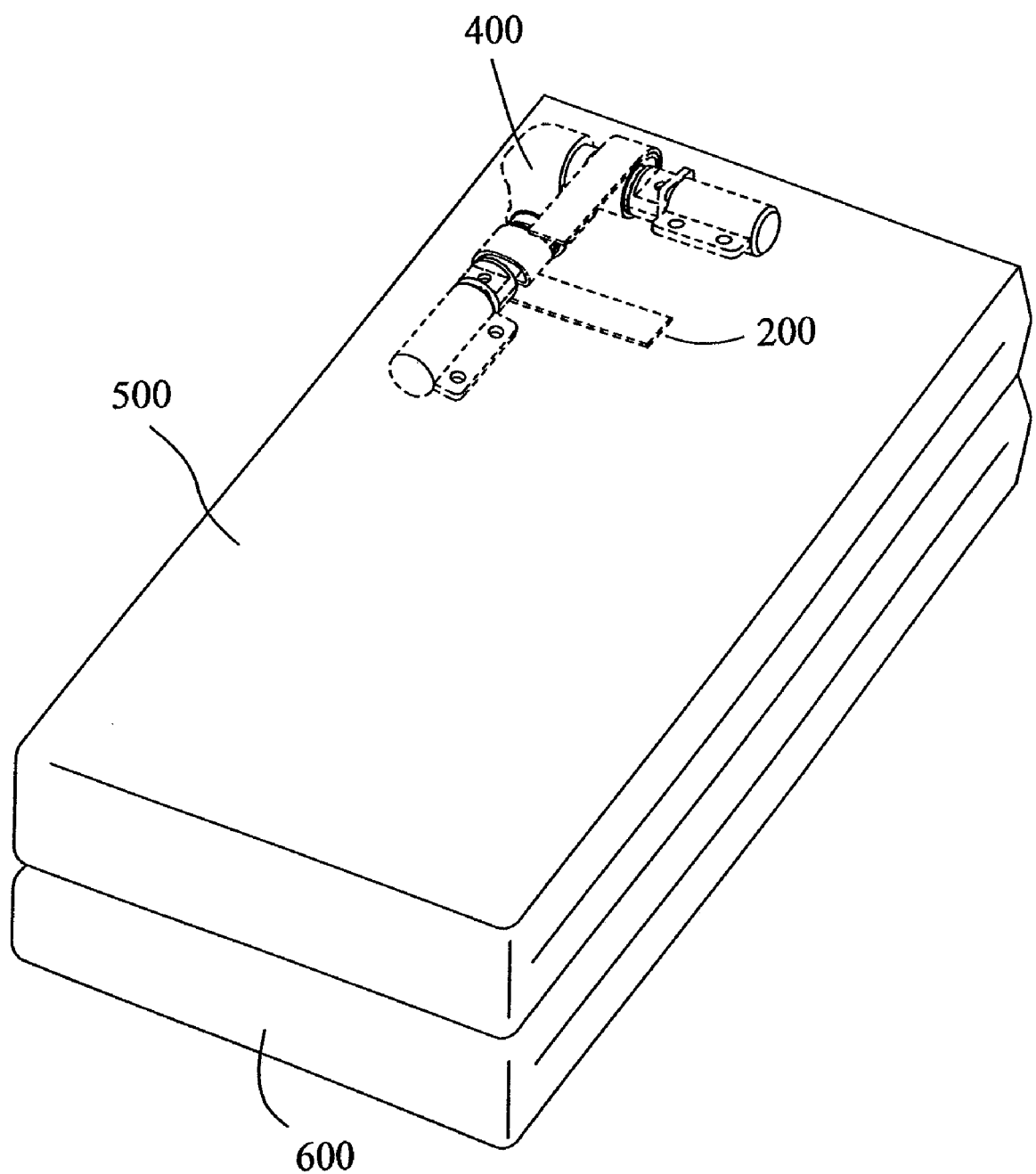
FIG. 5 shows an isometric view of a dual-axis circuit board assembled into a foldable device of the preferred embodiment of the present invention.

Referring to FIG. 5, the flexible dual-axis circuit board 200 and the dual-axis hinge 400 are assembled into a foldable device (like a cellular phone), wherein the foldable device can be folded along two orthogonal directions. For example, when the upper circuit board 220 circles around the upper hinge 410 and is assembled into an upper cover 500 of the foldable device, the upper cover 500 can open along the direction perpendicular to the upper hinge 410 to operate like a cellular phone; and the lower circuit board 230 circles around the lower hinge 420 and is assembled into a body 600 of the foldable device. The body 600 can open along the direction perpendicular to the lower hinge 420 to operate like a laptop. Because the upper hinge 410 of the dual-axis hinge 400 can be contained within the upper cover 500 of the foldable device and the lower hinge 420 can be contained within the body 600 of the foldable device, the upper cover 500 and the body 600 of the foldable device do not need the raised parts and indentations of traditional structures, which are unattractive and exposed.

According to the composition and the embodiments above, the present invention has many advantages over the prior art, such as the following:

1. The dual-axis circuit board circles the hinge so that the motive space of the hinge is resilient; therefore, the stress produced by frequent operation can be absorbed effectively. The likelihood that the electric transmission components of the circuit board become damaged is greatly reduced and allows an electronic product greater durability.

2. The dual-axis circuit board is independent from the circuit board that extends from the upper cover or the body. If the dual-axis circuit board is damaged, its material, maintenance and time costs are lower. The independent design also improves an electronic product's mass producibility.

3. The dual-axis circuit board allows for changing its transition angles or the number of its circles in order to accommodate different hinge structure needs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A three-dimensional dual-axis hinge module for assembling into a foldable device having an upper cover and a body, the three-dimensional dual-axis hinge module comprising:

a dual-axis hinge comprising an independent upper component and an independent lower component, wherein the independent upper component and the independent lower component form a perpendicular connecting section, an upper hinge and a lower hinge after the independent upper component and the independent lower component are assembled, wherein the upper hinge is extended from the perpendicular connecting section and approximately perpendicular to the perpendicular connecting section, the lower hinge is extended from the perpendicular connecting section and approximately perpendicular to the perpendicular connecting section and the upper hinge is approximately perpendicular to the lower hinge; and a dual-axis circuit board comprising a connecting section circuit board, an upper circuit board and a lower circuit board, the connecting section circuit board further comprising a raised section, an upper transition section and a lower transition section, wherein the dual-axis circuit board is assembled between the independent upper component and the independent lower component of the dual-axis hinge, and the raised section, the upper transition section and the lower transition section are fixed in the perpendicular connecting section; wherein the dual-axis circuit board further comprises an upper folding mark and a lower folding mark, and the raised section, the upper transition section, the lower transition section, the upper folding mark and the lower folding mark are fixed with the perpendicular connecting section, wherein the upper folding mark is fixed at a corner formed with the perpendicular connecting section and the upper hinge, and the lower folding mark is fixed at another corner formed with the perpendicular connecting section and the lower hinge to prevent the dual-axis circuit board from sliding inside the perpendicular connecting section.

2. The three-dimensional dual-axis hinge module for assembling into the foldable device of claim 1, wherein the upper circuit board circles the upper hinge as at least one upper loop, and the lower circuit board circles the lower hinge as at least one lower loop.

3. The three-dimensional dual-axis hinge module for assembling into the foldable device of claim 1, wherein the upper loop can be incorporated into an upper cover of the foldable device, which makes the upper cover open along the vertical direction of the upper hinge.

4. The three-dimensional dual-axis hinge module for assembling into the foldable device of claim 1, wherein the lower loop can be incorporated into the body of the foldable device, which makes the body open along the vertical direction of the lower hinge.

5. The three-dimensional dual-axis hinge module for assembling into the foldable device of claim 1, wherein the dual-axis circuit board is flexible.

6. The three-dimensional dual-axis hinge module for assembling into the foldable device of claim 1, wherein the foldable device can be folded in two orthogonal directions.

7. The three-dimensional dual-axis hinge module for assembling into the foldable device of claim 1, wherein the upper hinge further comprises an upper concave loop, and the lower hinge further comprises a lower concave loop.

8. The three-dimensional dual-axis hinge module for assembling into the foldable device of claim 7, wherein the upper circuit board circles at least once on the upper concave loop, and the lower circuit board circles at least once on the lower concave loop.

9. The three-dimensional dual-axis hinge module for assembling into the foldable device of claim 1, wherein the upper hinge is entirely embedded within the upper cover, and the lower hinge is entirely embedded within the body.

10. The three-dimensional dual-axis hinge module for assembling into the foldable device of claim 1, wherein the upper hinge is entirely embedded within the upper cover, and the lower hinge is entirely embedded within the body.

11. The three-dimensional dual-axis hinge module for assembling into the foldable device of claim 10, wherein the upper hinge further comprises an upper concave loop, and the lower hinge further comprises a lower concave loop.

12. The three-dimensional dual-axis hinge module for assembling into the foldable device of claim 11, wherein the upper circuit board circles at least once on the upper concave loop, and the lower circuit board circles at least once on the lower concave loop.

* * * * *